US006921626B2

(12) United States Patent
Ray et al.

(10) Patent No.: US 6,921,626 B2
(45) Date of Patent: Jul. 26, 2005

(54) NANOPASTES AS PATTERNING COMPOSITIONS FOR ELECTRONIC PARTS

(75) Inventors: Kevin Barry Ray, Fort Collins, CO (US); Ken-Ichi Shimazu, Briarcliff Manor, NY (US); Anthony Paul Kitson, Evans, CO (US)

(73) Assignee: Kodak Polychrome Graphics LLC, Norwalk, CT (US)

(*) Notice: Subject to any disclaimer, the term of this patent is extended or adjusted under 35 U.S.C. 154(b) by 119 days.

(21) Appl. No.: 10/400,714

(22) Filed: Mar. 27, 2003

(65) Prior Publication Data

US 2004/0191695 A1 Sep. 30, 2004

(51) Int. Cl.[7] .............................. G03C 5/00; G11B 7/24
(52) U.S. Cl. .................... 430/311; 430/270.1; 430/315; 430/320; 430/322; 430/330; 430/631; 430/944; 430/964
(58) Field of Search .................. 430/320, 311, 430/315, 31, 545, 524, 530, 330, 964, 270.1, 322, 944; 427/96, 511, 514; 347/100, 102

(56) References Cited

U.S. PATENT DOCUMENTS

| 5,698,360 | A | 12/1997 | Timpe et al. ............. 430/175 |
|---|---|---|---|
| 5,700,619 | A | 12/1997 | Baumann et al. ......... 430/175 |
| 5,738,013 | A | 4/1998 | Kellett .................... 101/463.1 |
| 5,925,491 | A | 7/1999 | Baumann et al. ......... 430/175 |
| 6,341,560 | B1 | 1/2002 | Shah et al. .............. 101/463.1 |
| 6,348,295 | B1 * | 2/2002 | Griffith et al. ............. 430/198 |
| 6,359,056 | B1 | 3/2002 | Aurenty et al. ............ 524/556 |
| 6,432,526 | B1 | 8/2002 | Arney et al. ............... 428/328 |
| 6,664,027 | B2 * | 12/2003 | Griffith et al. ............. 430/311 |
| 2003/0168639 | A1 * | 9/2003 | Cheon et al. .............. 252/500 |
| 2004/0191640 | A1 | 9/2004 | Ray et al. |
| 2004/0191641 | A1 | 9/2004 | Ray et al. |

FOREIGN PATENT DOCUMENTS

| EP | 1 120 247 | 8/2001 |
|---|---|---|
| EP | 1 157 825 | 11/2001 |
| EP | 1 157 826 | 11/2001 |
| EP | 1 157 827 | 11/2001 |
| EP | 1 157 828 | 11/2001 |
| EP | 1 211 063 | 6/2002 |
| WO | WO 95/23244 | 8/1995 |
| WO | WO 00/37254 | 6/2000 |
| WO | WO 01/11426 | 2/2001 |
| WO | WO 01/54915 | 8/2001 |
| WO | WO 02/47447 | 6/2002 |
| WO | 02/48432 A2 * | 6/2002 |
| WO | 03/038002 A1 * | 5/2003 |

* cited by examiner

*Primary Examiner*—Thorl Chea
(74) *Attorney, Agent, or Firm*—Faegre & Benson LLP

(57) ABSTRACT

The present invention provides methods of making an electronic part in which a nanopaste composed of inorganic nanoparticles and a carrier is applied onto a surface of a substrate. The composition is then processed to form an electrically conductive pattern area that adheres to the surface of the substrate. Optionally, the conductivity of the pattern area may be improved by heating.

51 Claims, No Drawings

NANOPASTES AS PATTERNING COMPOSITIONS FOR ELECTRONIC PARTS

BACKGROUND OF THE INVENTION

Printed circuit boards and other electronic parts generally include electrically conductive patterns or tracks formed on a non-conductive surface of a substrate. The electrically conductive patterns are traditionally formed by selectively applying an etchant to a layer of conductive material applied onto the non-conductive surface of the substrate. Portions of the conductive layer that contact the etchant are removed to reveal the surface of the substrate, and portions of the conductive layer that are not contacted by the etchant remain in the form of the desired conductive pattern. Selective application of the etchant is normally accomplished by placing an etch resistant mask over the conductive layer such that only those portions of the conductive material intended to form the conductive patterns are covered with the etch resistant mask. During etching, revealed portions of the conductive layer are removed, while portions covered with the mask remain. The etch resistant mask may then be removed to reveal a conductive metal pattern.

A conventional method of forming an etch resistant mask is to apply a layer of etch resistant material over the conductive layer. The etch resist material may then be pattern-wise exposed to radiation, such that exposed portions of the mask are less resistant to a developer than unexposed portions. The unexposed portions are then removed by a developer form an etchant resistant mask in a desired pattern. During etching, portions of the conductive layer not covered by the mask are etched away to reveal a non-conductive substrate. However, undeveloped portions of the etch resistant material and the conductive material underneath those portions remain. The unexposed portions of the etch resistant material may then be removed by known stripping processes to reveal a conductive metal pattern on the substrate. One drawback to this method of forming a conductive pattern is that a radiation exposure step, development step and an etching step are required.

An alternative method for forming an etch resistant mask is reported in WO 95/23244. In this reported method, an etch resistant mask may be formed by patternwise applying an etch resistant material via an ink-jet printer. The printed circuit board is then selectively etched to remove portions of the conductive layer not covered by the etch resistant mask. The etch resistant mask may then be removed to expose the conductive metal pattern. Although this method eliminates the radiation exposure step required by conventional mask formation, an etching step must still be performed.

WO 02/47447 reports a method of forming an electronic part in which a non-conductive material is patternwise ink-jet applied to a substrate surface to provide a channel into which a conductive material may then be deposited. The channel is created to prevent the lateral spread of conductive material that may create undesirable short circuits between conductive patterns. Although the reported method eliminates the radiation and etching steps of traditional electronic part formation, a non-conductive material must still be applied to the substrate prior to application of the conductive ink.

It has been recognized that it would be desirable to avoid the radiation, development and/or etching steps by directly patternwise applying a conductive material to a substrate to form an electronic part. However, accomplishing patternwise application of electrically conductive material is problematic for several reasons. First, as noted in WO 02/47447, conventional conductive materials may have a tendency to spread on the substrate surface before solidifying. Second, the high loading of conductive particles generally required to provide patterns with good electrical conduction tends to increase the viscosity of the deposition liquid to a point at which ink-jet application is difficult or impossible. Third, conductive materials that have been ink-jet applied may lack suitable electrical conductivity for certain applications

SUMMARY OF THE INVENTION

In one embodiment, the present invention provides a method of making an electronic part in which a nanopaste is patternwise ink-jet applied onto a surface of a substrate. The nanopaste is then treated by, for example, air drying, oven drying or radiation curing to form an electrically conductive pattern. The resulting electrically conductive pattern may have a an electrical resistance of less than 100 kilo ohms/1000 feet resistance at 20° C., more particularly between about 50 and 100 kilo ohms/1000 feet resistance at 20° C.

The substrate used in the method of the present invention may be formed from an electrically non-conductive material, for example, a polymer or a polymer laminate. As used herein, the term "nanopaste" refers to a mixture or sol composed of inorganic nanoparticles dispersed in a carrier. The inorganic nanoparticles generally have an average diameter of less than about 50 nm, more particularly less than about 25 nm and even more particularly less than about 15 nm. In one embodiment, the inorganic nanoparticles are composed of metals, such as silver, palladium or combinations thereof.

Suitable carriers depend on the specific composition and the desired application, but generally include organic carriers, aqueous carriers and mixtures of organic and aqueous liquids. In certain embodiments, the nanopaste is an inorganic nanopaste including inorganic nanoparticles in a substantially aqueous carrier. In these embodiments, the carrier may be composed of water or mixtures of water with water-miscible organic solvents such as suitable alcohols.

The inorganic nanoparticles may form a stable dispersion in the carrier at room temperature. Further, the inorganic nanoparticles are of such a size that the viscosity of the dispersion is surprisingly low. This property, in part, allows for a high concentration of inorganic nanoparticles to be included in the nanopaste without adversely affecting the application of the nanopaste to a substrate. In one embodiment, the inorganic nanoparticles compose between about 0.5 and about 75 w/w % of the nanopaste.

The nanopaste may optionally include additional components, such as dispersing agents, binders, surfactants, humectants, biocides, viscosity builders, colorants, pH adjusters, drying agents, defoamers or combinations thereof.

In another embodiment, the present invention provides a method of making an electronic part in which a thermally sensitive composition including a nanopaste and an optional radiation absorber is applied onto a surface of a substrate and then treated to form a layer. The layer is then patternwise exposed to radiation to affect the solubility of exposed portions of the substrate relative to unexposed portions of the substrate. The layer is then contacted with a developer such that either the exposed or unexposed portions of the substrate are removed to form an electrically conductive pattern. The resulting electrically conductive pattern may have a an electrical resistance of less than 100 kilo ohms/1000 feet resistance at 20° C., more particularly between about 50 and 100 kilo ohms/1000 feet resistance at 20° C.

Regardless of the method of forming the electrically conductive pattern area, the conductivity of the resulting pattern area may be substantially increased by heating the pattern area. In one embodiment, the pattern area may be heated to between about 100 and 200° C., more particularly about 100 to 160° C. for between about 30 seconds and 2 minutes. The electrical resistance after heating may be less than about 1 kilo ohm/1000 feet at 20° C., more particularly less than 500 ohms/1000 feet resistance at 20° C.

In another embodiment, the present invention provides a method of forming an electrically conductive pattern on a substrate, in which a composition including a nanopaste is applied to a surface of a substrate. Application onto the substrate may be accomplished by forming a coating on the substrate or by patternwise ink-jet application. The composition is processed to form an electrically conductive pattern area. Such processing may include radiation exposure, development and treatment by air drying, oven drying or radiation curing. The pattern area may be heated either prior to or after processing to affect one or more properties of the nanopaste.

DETAILED DESCRIPTION

The present invention provides methods of forming electrically conductive patterns on a substrate for use in electronic parts such as printed circuit boards. In one embodiment, a nanopaste is applied onto a surface of the substrate, and is then processed to form an electrically conductive pattern area.

Suitable substrates for the present invention may vary widely depending upon the desired application and the specific composition employed. Suitable substrates or substrate surfaces may be electrically non-conductive, and may be composed of polymers, ceramics, stiff papers, fibrous materials and/or laminates or composites of these materials. Suitable polymeric supports include polyethylene terephthalate films, polyester films and epoxy laminates. Substrates composed of a mixture of fibrous materials and a polymeric binder are also suitable. Suitable fibrous materials include cellulose materials (e.g. wood pulp, wood fibers, cotton), acetylated, aminized, or cyanoethylated cotton, polyesters, nylon, ceramics (e.g. glass fibers, silica, boron, silicon nitride), metal and metal alloy fibers and carbon fibers. Suitable binders include amide, epoxy and phenolic resins. A specific example of such a substrate includes the Nema FR4 N4000-2 available from New England Laminates Ltd., Skelmersdale, UK, which is composed of an epoxy resin reinforced with woven borosilicate glass fiber yarn and modified to be absent of a copper layer. Suitable substrates may be further treated by known methods to improve adhesion of the nanopaste to the substrate surface.

The nanopaste of the present invention may be composed of inorganic nanoparticles and a carrier. Examples of suitable inorganic nanoparticles include metal nanoparticles composed of silver, palladium, gold, platinum, nickel, copper or mixtures or alloys of these materials. The inorganic nanoparticles are generally formed by gas evaporation or other known methods, and have an average diameter of less than 50 nm, more particularly less than 25 nm and even more particularly less than 15 nm.

Suitable carriers for use in the nanopaste of the present invention may include aqueous carriers, organic carriers and mixtures of aqueous and organic liquids. In one embodiment, the nanopaste is an inorganic nanoparticle composed of inorganic nanoparticles in a substantially aqueous carrier. As used herein, the phrase "substantially aqueous carrier," refers to carriers containing greater than about 50 v/v % water. Examples of suitable substantially aqueous carriers include solutions of 100 v/v % water and mixtures of water and water-miscible organic liquids such as alcohols.

Specific examples of the nanopastes described herein include a silver/palladium sol having a metallic particle average diameter of 11.1 nm supplied in a 5 w/w % solution in water by ANP, Kumho-ri, Buyong-nyeon, Chungwon-Kun, Chungcheongbukdo, Korea. Another example is a silver sol having a metallic particle average diameter of 11.0 nm supplied in a 5 w/w % solution in water by ANP.

At room temperature, the nanopaste acts as a stable aqueous dispersion in a desired carrier. Due, in part, to the small size of the inorganic nanoparticles, a relatively large inorganic nanoparticle concentration may be used in the nanopaste while still maintaining a suitable viscosity for application onto a substrate. In one embodiment, the nanopaste may be composed of between about 0.5 and about 75 w/w % inorganic nanoparticles. In another embodiment, the nanopaste may be composed of between about 0.5 and about 25 w/w % inorganic nanoparticles. In yet another embodiment, the nanopaste may be composed of between about 0.5 and about 10 w/w % inorganic nanoparticles.

Optionally, the nanopaste may also include a surfactant or other dispersing agent to promote a stable dispersion of the inorganic nanoparticles in the carrier. Examples of suitable dispersing agents include cationic, anionic, amphoteric and non-ionic surfactants. Specific examples include perfluoroalkyl, alkylphenyl, or polysiloxane surfactants. Suitable polysiloxane surfactants include polyether/polysiloxane copolymer, alkyl-aryl modified methylpolysiloxane and acylated polysiloxane. Other suitable surfactants include sorbitan tristearate, sorbitan monopalmitate, sorbitan triolate, mono glyceride stearate, polyoxyethylene nonylphenyl ether, alkyl di (aminoethyl) glycine, alkyl polyaminoethylglycine hydrochloride, 2-alkyl-n-carboxyethyl-N-hydroxyethyl imidazolinium betaine, and N-tetradecyl-N, N-substituted betaine.

Additional surfactants include alkylated surfactants, fluorosurfactants and siliconated surfactants. Examples of these surfactants include sodium dodecylsulfate, isopropylamine salts of an alkylarylsulfonate, sodium dioctyl succinate, sodium methyl cocoyl taurate, dodecylbenzene sulfonate, alkyl ether phosphoric acid, N-dodecylamine, dicocoamine, 1-aminoethyl-2-alkylimidazoline, 1-hydroxyethyl-2-alkylimidazoline, cocoalkyl trimethyl quaternary ammonium chloride, polyethylene tricecyl ether phosphate and the like.

Examples of suitable fluorosurfactants also include ZONYL FSD, ZONYL FSA, ZONYL FSP, ZONYL FSJ, ZONYL FS-62, ZONYL FSK, ZONYL FSO, ZONYL FS-300, ZONYL FSN, and OLIN 10G, all of which are commercially available from E.I. Du Pont De Nemours & Co. Additional examples of suitable fluorosurfactants include FLUORAD FC-135, FLUORAD FC-129, FLUORAD FC-120, FLUORAD FC-100, FLUORAD FC-170C FLOURAD FC431 and FLUORAD FC-171, all of which are commercially available from 3M, St. Paul, Minn.

Further examples of suitable surfactants include polyether modified poly-dimethyl-siloxane, silicone glycol, polyether modified dimethyl-polysiloxane copolymer, and polyether-polyester modified hydroxy functional polydimethylsiloxane.

Optionally, the nanopaste may also include polymeric binders, which may affect the physical and mechanical properties of the nanopaste. Suitable binders may be soluble or dispersible in the carrier used in a particular nanopaste. Such binders may be suitably soluble in organic carriers, aqueous carriers and/or mixtures of organic and aqueous solutions.

Examples of suitable binders include epoxy resins, modified epoxy resins, polyester resins, novolak resins, cellulosic materials such as hydroxypropylcellulose, hydroxyethylcellulose, hydroxypropylmethylcellulose and carboxymethylcellulose, copolymers of vinylidene chloride and acrylonitrile, acrylic acid resins, polyvinyl resins, silicone resins, polyamide resins, vinyl alcohol resins, resol resins, acetal resins, polyacrylonitrile resins, formaldehyde resins, polycarbonate resins, polyimide resins, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum and copolymers or derivatives thereof.

Additional examples may include epoxy resins produced by the condensation of epichlorohydrin and Bisphenol A or F, epoxy novolak resins, rubber modified epoxy resins, Bisphenol A based polyester resins, epoxydized o-cresylic novolaks, urethane modified epoxy resins, phosphate modified Bisphenol A epoxy resins, cellulose esters, copolymers of vinylidene chloride and acrylonitrile, poly(meth) acrylates, polyvinyl chloride, silicone resins, polyesters containing hydroxy or carboxy groups, polyamides comprising amino groups or carboxy groups, polymers and copolymers of vinyl alcohol, polyvinylimidazole, polyvinylpyrrolidone, polymers and copolymers of vinylphenol, acrylamide, methylol acrylamide, methylol methacrylamide, polyacrylic acid, methacrylic acid, hydroyethyl acrylate, hydroxethyl methacrylate, maleic anhydride/vinyl methyl ether copolymers, novolak resin, resol resin, polyvinyl phenol resin, copolymers of acrylic acid, polyacetal, poly(methyl methacrylate), polymethacrylic acid, polyacrylonitrile, cellulose acetate, cellulose acetate butyrate, cellulose acetate propionate, melamine formaldehyde resins, polycarbonates, polyimides and urea formaldehyde resins.

Optionally, the nanopaste may also include humectants, biocides, viscosity builders, colorants, pH adjusters, drying agents, defoamers or combinations thereof. Suitable humectants may prevent the inkjet nozzles described below from clogging and/or drying out. Examples of suitable humectants include ethylene glycol and sorbitol. Suitable biocides include Proxel GXL (supplied by Zeneca Corporation), Kathion X L (supplied by Rohm and Haas) and Triclosan (supplied by Ciba Specialty Chemicals). An example of a suitable viscosity builder includes polyethylene glycol.

In one embodiment, the nanopaste may form a thermally sensitive composition. In this embodiment, the thermally sensitive composition may include a suitable radiation absorber. Radiation absorbers may absorb ultraviolet, visible, and/or infrared radiation and convert it to heat to affect the solubility of the thermally sensitive composition in a developer. The radiation absorber may be composed, for example, of a dye or pigment. In one embodiment, the radiation absorber may compose between about 0.25 to about 25 w/w % of the thermally sensitive composition. In embodiments in which the radiation absorber is a dye, the dye may compose between about 0.25 to about 15 w/w % of the thermally sensitive composition. In embodiments in which the radiation absorber is a pigment, the pigment may compose between about 5 to about 25 w/w % of the thermally sensitive composition.

Suitable radiation absorbers may be soluble or dispersible in the carrier selected for use in the nanopaste. Examples of suitable dyes and pigments include dyes or pigments of the squarylium, merocyanine, indolizine, pyrylium, or metal diothiolene class. Examples of radiation absorbing pigments are Projet 900, Projet 860 and Projet 830 (all available from the Zeneca Corporation), and carbon black. Dyes, especially dyes with a high extinction coefficient in the range of 750 nm to 1200 nm, are suitable. Radiation absorbing dyes are disclosed in numerous publications, for example, Nagasaka, EP 0 823 327; Van Damme, EP 0 908 397; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors).

In one embodiment, the radiation absorber may be soluble in substantially aqueous carriers. Examples of such dyes include IR Dyes A, B, C, D and E, the structures of which are provided below:

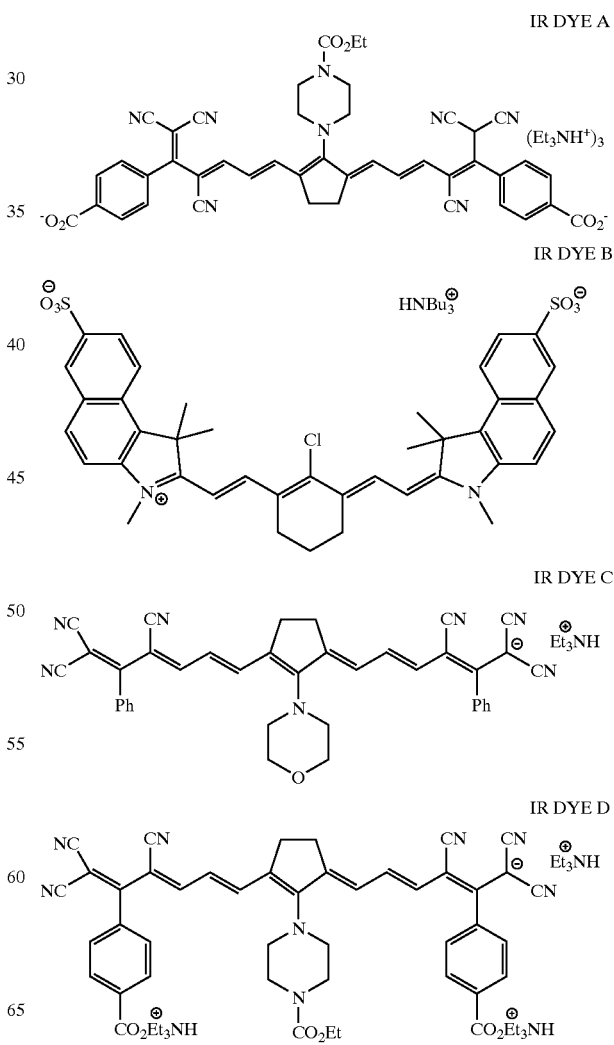

-continued

UR DYE E

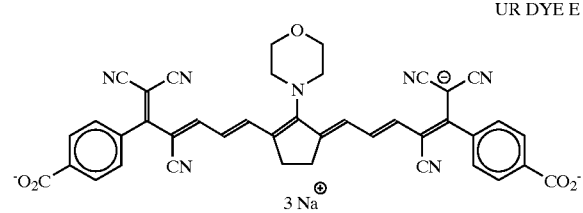

The nanopaste may be applied to the surface of a suitable substrate by two general methods. In one embodiment, the nanopaste may be applied to the substrate by patternwise providing droplets to the surface of the substrate by, for example, using inkjet printing techniques and devices. In this manner, the nanopaste can be applied in a controlled, patternwise fashion to the surface of the substrate by ejecting droplets from a plurality of nozzles or orifices in a print head of an ink jet printer (such as a piezoelectric ink jet printing head).

Generally speaking, patternwise ink-jet application of fluids may be substantially affected by the properties and/or behavior of the fluid. For example, the viscosity and surface tension of an ink-jetted fluid may affect the ink-jet velocity, droplet size, droplet separation length, stream stability and other ink jetting characteristics of the fluid.

The droplets formed from the nanopaste of the present invention may have a surface tension in the range from 20 to 60 dynes/cm, more particularly from 30 to 50 dynes/cm. The viscosity of the nanopaste may be less than or equal to 20 centipoise, more particularly from 1 to 10 centipoise, even more particularly from 1 to 5 centipoise at room temperature. Furthermore, the nanoparticles used in the nanopaste of the present invention are sized such that ink-jet application may be performed without substantial clogging of the ink-jet nozzles or orifices.

Commercially available ink jet printers use various schemes to control the deposition of the nanopaste. Such schemes are generally of two types: continuous stream and drop-on-demand. In drop-on-demand systems, the fluid droplets are ejected from orifices directly to a position on the support by pressure created by, for example, a piezoelectric device, an acoustic device, or a resistive heater controlled in accordance with digital signals. Thus, fluid droplets are not generated and ejected through the orifices of the print head unless they are needed to print pixels. Continuous ink jet printers produce smaller droplet sizes for a generally higher resolution, but the fluids must be conductive because the fluid droplets are selectively deflected between the substrate and a collection reservoir by implementing electrostatic deflectors.

The nanopaste described herein may have characteristics that are compatible with both drop-on-demand and continuous ink-jet systems, such as suitable driving voltages and pulse widths for thermal inkjet printers, suitable driving frequencies of the piezoelectric element for drop-on-demand device or continuous devices, and suitable particle sizes for ejection from nozzles of a variety of shapes and sizes. However, the nanopaste may be particularly suited for use with drop-on-demand ink-jet systems.

Suitable ink-jet printers for imagewise application of the nanopaste composition being used, and generally include the JetPlate ink-jet printer, available from Pisces-Print Imaging Sciences Inc., Nashua, NH, the Xaarjet Evaluation Kit, Model No. XJ126R supplied by Xaarjet, Cambridge, UK, the Hewlett Packard DeskJet 970 CXI ink jet printer, the Hewlett Packard 540C ink jet printer, the Epson Stylus Color 600 ink jet printer, the Epson 740 ink jet printer, the Epson 800 ink jet printer, the Epson Stylus Color 900 ink jet printer, the Epson Stylus PRO9600 ink jet printer and the Epson Stylus Color 3000 ink jet printer.

The imagewise applied nanopaste may then be treated to remove substantial amounts of the carrier and/or additional components, such as the dispersing agent, to form a durable image area on the substrate. Suitable treatments may include air drying, oven drying and radiation curing. In one embodiment, the layer may be heated in an oven at between about 50° C. and about 200° C. for between about 30 seconds and about two minutes. In another embodiment, the layer may be heated at less than about 100° C. for about 1 minute.

In another embodiment, the nanopaste may be a thermally sensitive composition applied by spin coating, bar coating, gravure coating or roller coating onto the substrate surface. The thermally sensitive composition may then be treated by air drying, oven drying or radiation curing to form a layer. For example, the layer may be heated in an oven at between about 50° C. and about 200° C. for between about 30 seconds and about two minutes. In another example, the layer may be heated at about 80° C. for about 1 minute. The treatment step may remove and/or evaporate portions of the carrier and certain optional components, such as the dispersing agent.

The layer may then be patternwise exposed to thermal radiation, particularly to IR radiation, to affect the solubility of the exposed portions of the layer, such that exposed portions of the layer have a different solubility in a developer than unexposed portions. An example of a suitable radiation source is the Creo Trendsetter 3230, which contains a laser diode that emits near infrared radiation at a wavelength of about 830 nm and is available from Creo Products Inc., Burnaby, BC, Canada. Another suitable radiation source is a Crescent 42T Platesetter, an internal drum platesetter that operates at a wavelength of 1064 nm (Gerber Scientific, South Windsor, Conn., USA).

Either the exposed or unexposed portions may then be developed in a suitable developer that can penetrate and remove desired portions of the layer to form a pattern area. Useful developers include aqueous solutions having a pH of about 7.0 or above. More particularly, the developer may have a pH between about 8 and about 13.5, or between about 12 and about 14. Examples of suitable developers include 956 developer (a phenoxyethanol based developer), 955 developer (a benzyl alcohol developer) and Goldstar developer (a sodium metasilicate developer), all available from Kodak Polychrome Graphics, Norwalk, Conn. Other suitable developers may include PC3000, PC955 and PC9000 also supplied by Kodak Polychrome Graphics. Developers are also described, for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2,276,729 (DE-A-4 411 176); and Fiebag, U.S. Pat. No. 6,143,479.

The developer may be applied to the radiation exposed layer in any suitable manner, including by brushing, wiping, rubbing or spraying. In one embodiment, the layer is developed in a Mercury Mark V Processor supplied by Kodak Polychrome Graphics. Development time may range depending on the type of developer and the composition of the layer. Suitable development time may range from 15 seconds to two minutes. Optionally, the resulting pattern area may be dried with hot air, oven heat or IR radiators.

The electrically conductive pattern areas formed by either of these methods may be particularly useful in the formation of electronic parts, such as printed circuit boards. The electronic pattern areas may exhibit an electrical resistance of less than 100 kilo ohms, more particularly between about 50 and 100 kilo ohms per 1000 feet resistance at 20° C. Importantly, increased electrical conductivity may be achieved by heating the pattern area at between about 100° C. and about 200° C. for between about 30 seconds and two minutes. This heating process may allow the nanoparticles to contact and weld together to improve the conductivity of the pattern area. After heating, the conductive patterns may exhibit an electrical resistance of less than about 1 kilo ohms, more particularly less than about 500 ohms/1000 feet resistance at 20° C.

The present invention is further described in the following Examples:

EXAMPLE 1

Ink-Jet Formation of a Printed Circuit Board

A sample of Nema FR4 N4000-2, an epoxy laminate available from New England Laminates Ltd, Skelmersdale, UK and composed of woven borosilicate glass fiber yarn, was modified so as to be free of copper layers. This was accomplished by immersing the laminate in a CuCl$_2$ stripping solution, which was composed of water (100 kg), anhydrous copper chloride (40 kg), and HCl (60 kg of a 28 w/w % solution)), at 60° C. until the copper was removed. The remaining laminate was then washed with water and dried.

The resulting substrate was then placed on the platten of a JetPlate printer (available from Pisces-Print Imaging Sciences Inc., Nashua, N.H.) and a conductive pattern area was then produced by patternwise ink-jet application of Ag/Pd sol, a nanopaste having a metallic particle mean diameter of 11.1, supplied as a 5 w/w % solution in water and available from ANP. The pattern area was dried, and then the electrical conductivity of the pattern area was measured. On average, the pattern area provided 60 kilo ohms per 1000 feet of resistance at 20° C.

The circuit board was then heated in an oven at 150° C. for 60 seconds, and the pattern area was again tested for electrical conductivity. After heating, the pattern area provided an average of only 380 ohms per 1000 feet resistance at 20° C.

EXAMPLE 2

Formation of an Electronic Part

A sample of Nema FR4 N4000-2 is modified as in Example 1 so as to be free of copper layers. The resulting substrate is coated via a wire wound bar with a layer of a thermally sensitive composition composed of Ag sol (90 w/w %) and IR dye A (10 w/w %). Ag sol is an inorganic nanopaste having a metallic particle mean diameter of 11.0 nm in a 5 w/w % solution in water, which is available from ANP, Korea. IR dye A is represented by the following structure:

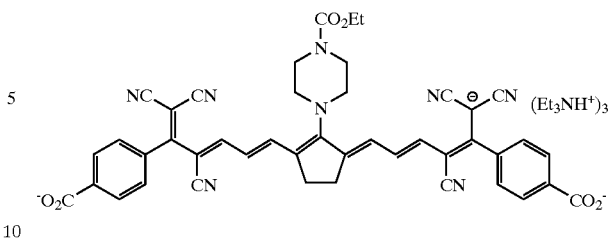

A sample of the resulting plate precursor is then patternwise exposed at 195 mJ/cm$^2$ using an internal test pattern on a Creo Trendsetter 3230, a placesetter operating at a wavelength of 830 nm and available from Creo Products Inc., Burnaby, BC, Canada. Exposure results in a color change from gray to copper-like. The sample is then immersed for 20 seconds in 956 developer, a phenoxyethanol based developer available from Kodak Polychrome Graphics, Norwalk Conn. The non-exposed areas are washed away, revealing the epoxy laminate substrate, while the pattern area (corresponding to the internal test pattern) remains.

The electrical conductivity of the pattern area is then measured. On average, the pattern area provides a resistance of 60 kilo ohms per 1000 feet at 20° C. The circuit board is then heated in an oven at 150° C. for 60 seconds, and the pattern area is again tested for resistance. After heating, the pattern area provides an average resistance of only 380 ohms per 1000 at 20° C.

What is claimed is:

1. A method of making an electronic part comprising:
   providing a substrate;
   applying onto a surface of the substrate a thermally sensitive composition comprising i) a nanopaste, which comprises inorganic nanoparticles and a carrier, and ii) a radiation absorber;
   treating the nanopaste to form a layer on the substrate;
   patternwise exposing the layer to thermal radiation to affect the solubility of exposed portions of the layer relative to unexposed portions of the layer; and
   developing the layer to remove the exposed or unexposed portions of the layer to form an electrically conductive pattern area.

2. The method of claim 1 wherein the substrate comprises a polymer or a polymer laminate.

3. The method of claim 1 wherein the substrate comprises an epoxy laminate.

4. The method of claim 1 wherein the surface of the substrate is electrically non-conductive.

5. The method of claim 1 wherein the inorganic nanoparticles comprise metallic nanoparticles.

6. The method of claim 5 wherein the nanoparticles comprise silver, palladium or a mixture of silver and palladium.

7. The method of claim 5 wherein the nanoparticles comprise copper, gold, platinum, nickel or combinations thereof.

8. The method of claim 1 wherein the inorganic nanoparticles have an average diameter of loss than about 50 nm.

9. The method of claim 1 wherein the inorganic nanoparticles have an average diameter of less than about 25 nm.

10. The method of claim 1 wherein the inorganic nanoparticles have an average diameter of less than about 15 nm.

11. The method of claim 1 wherein the inorganic nanoparticles have an average diameter of less than about 10 nm.

12. The method of claim 1 wherein the nanopaste comprises a binder.

13. The method of claim 12 wherein the binder is soluble in substantially organic carriers.

14. The method of claim 12 wherein the binder is soluble in substantially aqueous carriers.

15. The method of claim 12 wherein the binder comprises epoxy resin, modified epoxy resin, polyester resin, novolak resin, cellulose resin, copolymers of vinylidene chloride and acrylonitrile, acrylic resin, polyvinyl resin, silicone resin, polyamide resin, vinyl alcohol resin, resol resin, acetal resin, polyacrylonitrile resin, formaldehyde resin, polycarbonate resin, polyimide resin, or copolymers or derivatives thereof.

16. The method of claim 12 wherein the binder comprises polyvinylpyrrolidone, polyvinyl alcohol, polyvinylimidazole, acrylic acid polymers, polyethyleneimine, poly(ethyloxazoline), gelatin, starches, dextrin, amylogen, gum arabic, agar, algin, carrageenan, fucoidan, laminaran, corn hull gum, gum ghatti, karaya gum, locust bean gum, pectin, guar gum, hydroxypropylcellulose, hydroxyethylcellulose, hydroxypropylmethylcellulose or carboxymethylcellulose.

17. The method of claim 1 wherein the nanopaste is free of binders.

18. The method claim 1 wherein the nanopaste comprises a dispersing agent.

19. The method of claim 18 wherein the nanopaste comprises between about 0.05 to 15.0 w/w % dispersing agent.

20. The method of claim 18 wherein the nanopaste comprises between about 0.1 to about 5.0 w/w % dispersing agent.

21. The method of claim 2 wherein the dispersing agent comprises a surfactant.

22. The method of claim 1 wherein the surfactant is a cationic, anionic or amphoteric surfactant.

23. The method of claim 21 wherein the surfactant is a non-ionic surfactant.

24. The method of claim 21 wherein the surfactant comprises a perfluoroalkyl, alkylphenyl, or polysiloxane surfactant.

25. The method of claim 21 wherein the surfactant comprises a polysiloxane polyether, polysiloxane copolymer, alkyl-aryl modified methyl-polysiloxane or acylated polysiloxane.

26. The method of claim 21 wherein the surfactant comprises sorbitan tristearate, sorbitan monopalmitate, sorbitan triolate, monoglyceride stearate or polyoxyethylene nonylphenyl ether.

27. The method of claim 21 wherein the surfactant comprises alkyl di (aminoethyl) glycine, alkyl polyaminoethylglycine hydrochloride, 2-alkyl-n-carboxyethyl-N-hydroxyethyl imidazolinium betaine, or N-tetradecyl-N, N-substituted betaine.

28. The method of claim 21 wherein the surfactant comprises an alkylated surfactant, a fluorosurfactant, a siliconated surfactant or combinations thereof.

29. The method of claim 1 wherein the nanopaste further comprises a humectant, biocide, viscosity builder, colorant, pH adjuster, drying agent, defoamer or a combination thereof.

30. The method of claim 1 wherein the carrier is a substantially organic carrier.

31. The method claim 1 wherein the carrier is a substantially aqueous carrier.

32. The method of claim 1 wherein the nanopaste comprises between about 0.5 and about 75 w/w % inorganic nanoparticles.

33. The method of claim 32 wherein the nanopaste comprises between about 0.5 and about 25 w/w % inorganic nanoparticles.

34. The method of claim 33 wherein the nanopaste comprises between about 0.5 and about 10 w/w % inorganic nanoparticles.

35. The method of claim 1 wherein the thermally sensitive composition comprises between about 0.25 to about 25 w/w % radiation absorber.

36. The method of claim 1 wherein the radiation absorber is a dye.

37. The method of claim 36 wherein thermally sensitive composition comprises between about 0.25 to about 15 w/w % dye.

38. The method of claim 1 wherein the radiation absorber is a pigment.

39. The method of claim 38 wherein thermally sensitive composition comprises between about 5 to about 25 w/w % pigment.

40. The method of claim 1 wherein the radiation absorber comprises the structure:

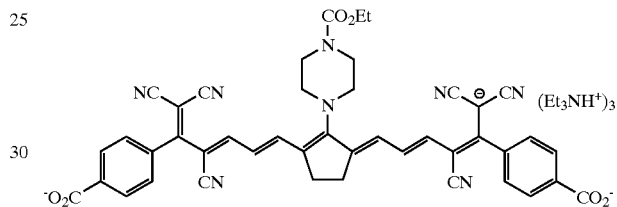

41. The method of claim 1 wherein the treating step comprises drying the layer.

42. The method of claim 1 wherein the treating step comprises air or oven drying the layer.

43. The method of claim 1 further comprising heating the layer to between about 100 and 200° C.

44. The method of claim 1 further comprising heating the layer to between about 100 and 160° C.

45. The method of claim 1 wherein the electrically conductive pattern area has an electrical resistance of less than 100 kilo ohms/1000 feet at 20° C.

46. The method of claim 1 wherein the electrically conductive pattern area has an electrical resistance of less than 1 kilo ohm/1000 feet at 20° C.

47. The method of claim 1 wherein the electrically conductive pattern area has an electrical resistance of less than 500 ohms/1000 feet at 20° C.

48. The method of claim 1 wherein the electrically conductive pattern area has an electrical resistance of between 300 and 500 ohms/1000 feet at 20° C.

49. The method of claim 1 further comprising heating the electrically conductive pattern area to increase the conductivity of the electrically conductive pattern area.

50. The method of claim 1 wherein the patternwise exposing step comprises patternwise exposing the composition to IR radiation.

51. The method of claim 1 wherein the developing step comprises developing the layer in an aqueous alkaline solution.

* * * * *